(12) United States Patent
Loon (10) Patent No.: US 7,615,404 B2
(45) Date of Patent: Nov. 10, 2009

(54) HIGH-CONTRAST LASER MARK ON SUBSTRATE SURFACES

(75) Inventor: Lee Kim Loon, Penang (MY)

(73) Assignee: Intel Corporation, Santa Clara, CA (US)

( * ) Notice: Subject to any disclaimer, the term of this patent is extended or adjusted under 35 U.S.C. 154(b) by 172 days.

(21) Appl. No.: 11/591,001

(22) Filed: Oct. 31, 2006

(65) Prior Publication Data

US 2008/0101034 A1 May 1, 2008

(51) Int. Cl.
*H01L 21/44* (2006.01)
*H01L 29/82* (2006.01)
*H05K 7/20* (2006.01)

(52) U.S. Cl. .................. 438/106; 257/704; 257/416; 257/797; 361/704; 361/707; 361/722

(58) Field of Classification Search ........................ None
See application file for complete search history.

(56) References Cited

U.S. PATENT DOCUMENTS

| | | | | |
|---|---|---|---|---|
| 5,294,812 A | * | 3/1994 | Hashimoto et al. | 257/65 |
| 5,313,193 A | * | 5/1994 | Dubois et al. | 340/572.1 |
| 5,361,150 A | * | 11/1994 | Noguchi | 349/84 |
| 5,475,268 A | * | 12/1995 | Kawagoe et al. | 257/797 |
| 5,917,239 A | * | 6/1999 | Bell et al. | 257/704 |
| 6,143,587 A | * | 11/2000 | Omizo | 438/106 |
| 6,400,037 B1 | * | 6/2002 | Omizo | 257/797 |
| 6,680,220 B2 | * | 1/2004 | Minamio et al. | 438/110 |
| 6,838,739 B2 | * | 1/2005 | Stelzl et al. | 257/416 |
| 7,312,418 B2 | * | 12/2007 | Tanabe et al. | 219/121.65 |
| 2006/0269851 A1 | * | 11/2006 | Frisa et al. | 430/5 |

* cited by examiner

*Primary Examiner*—Gregory D Thompson
(74) *Attorney, Agent, or Firm*—Blakely, Sokoloff, Taylor & Zafman LLP (57) ABSTRACT

As part of a first configured laser operation, a smooth, more reflective marking area is formed at a surface of a substrate (e.g., integral heat spreader, or IHS). In a second configured laser operation, a mark is formed at the surface of the substrate within the marking area. The mark contrasts strongly with the reflective surface of the substrate in the marking area. As a result, the mark may be read with an optoelectronic imaging system with a higher rate of reliability than marks disposed at a substrate surface having a microtopographical profile with greater variation from a nominal surface plane. An IHS with a mark so disposed provides benefits when include as a portion of an integrated circuit package, which in turn provides benefits when included as a portion of an electronic system.

13 Claims, 7 Drawing Sheets

HIGH-CONTRAST LASER MARK ON SUBSTRATE SURFACES

FIELD OF THE INVENTION

The invention relates generally to the field of product identification methods and features. In particular, the invention relates to laser marking of electronic packaging and other surfaces.

BACKGROUND OF THE INVENTION

IC (integrated circuit) packages are often marked for identification. Commonly the marks are placed on metallic surfaces of an integral heat spreader (IHS) assembled with or as a part of the IC package. The marks may be human readable, machine readable, or both, and are frequently used for tracking products throughout manufacturing. Typically however, if there is insufficient contrast between the character and/or features of a mark and the background of the surface upon which the mark has been formed, the readability of the mark is diminished.

Generally, the surfaces of integral heat spreaders are populated by small topographical features including scratches, pits, ridges and other such elevated features and/or depressions. These features may be clearly seen only by using a magnifying device, and to may be referred to as 'microtopographical' features. Although small, they tend to reflect and scatter light in a multitude of angles, presenting a 'cluttered' visual background for marks formed at a surface having such microtopographical features. As a result, marks so disposed are sometimes difficult to read and recognize, particularly for automated optoelectronic imaging systems as may be used in a high volume manufacturing environment.

The inability to accurately and reliably read identification marks or other marks on an IC package can interfere with manufacturing processes, product traceability, detection of product tampering, theft recovery, product authenticity confirmation, automated handling, inventory management, and numerous other operations throughout the lifetime of an IC device.

DETAILED DESCRIPTION OF THE INVENTION

Described herein is a method for forming, and various aspects of, a high resolution mark formed at a surface of a metallic substrate. A high resolution mark as described herein facilitates more reliable readability by an optoelectronic imaging system, as well as by the human eye. Throughout this description, various examples of a substrate as an integral heat spreader (IHS) are described. The reader should not interpret these examples in a limiting sense. It simply is not practical to provide in this description an exhaustive list encompassing the full range of substrates that can be marked as described herein.

Figure 1:
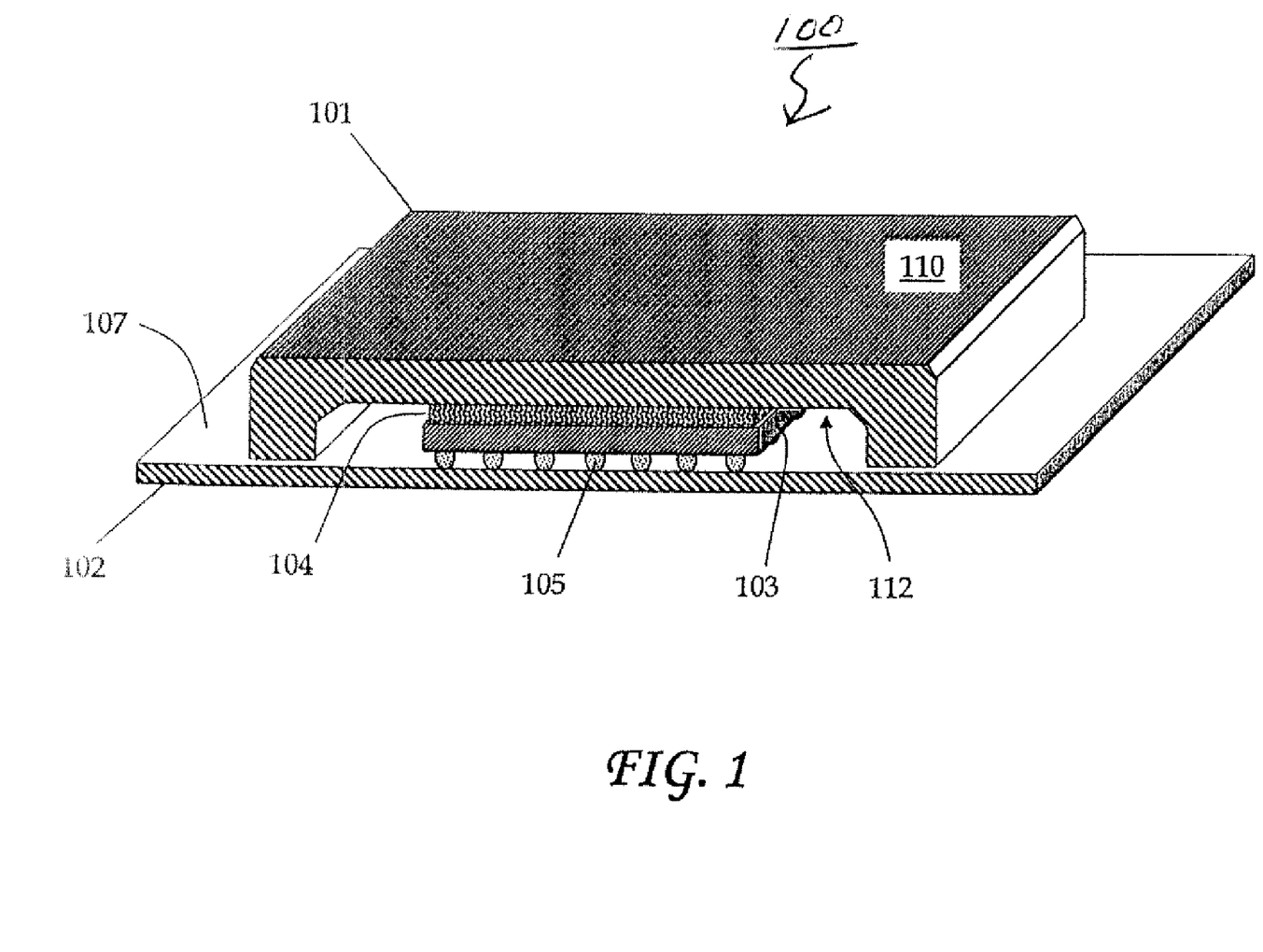
FIG. 1 depicts an oblique cross-sectional view of an integrated circuit package according to an embodiment of the invention.

FIG. 1 provides a view of an integrated circuit package 100 including an IHS 101. As depicted, an IHS 101 is disposed adjacent to a surface 107 of a substrate 102 forming a cavity between a lower surface 112 of the IHS 101 and the surface 107 of the substrate 102. For descriptive purposes hereinafter, the surface 107 of a substrate 102 directly adjacent to an IHS 101 is referred to as the 'upper surface', although this term is not intended to impart a limitation with regard to a spatial orientation of the substrate. The cavity so formed may be hermetically sealed to the upper surface 107, but alternatively, may be non-hermetically sealed. An integrated circuit (IC) device 103 is typically enclosed within the cavity, and disposed between the upper surface 107 of the substrate 102 and the lower surface 112 of the IHS 101. The IC 103 may be electrically and physically coupled with the substrate 102 by a plurality of interconnects 105, for example reflowed solder balls, bumps, or studs. An IC device 103 may further include a polymer material filling the interstitial spaces between the IC device 103 and the upper surface 107 of the substrate among the plurality of interconnects.

Typically disposed between the IC device 103 and the lower surface 112 of the IHS 101 is some type of thermally conductive material 104, generally known as a thermal interface material (TIM). The TIM conducts thermal energy (heat) away from an IC device 103 and conveys it to an IHS 101 to help cool the IC device 103. Examples of commonly used thermal interface materials 104 include thermal grease, thermal gaskets, and solder preforms (STIM), although numerous other materials and configurations can also be used to meet the same purpose with varying degrees of efficiency. A TIM 104 works best when it maintains intimate contact with a large surface area of the IHS 101 and a large surface of the IC device 103. Voids formed by gases trapped between the TIM 104 and either the IHS 101 or the IC device 103 reduce the thermal transfer efficiency of an IC/TIM/IHS assembly.

An IHS 101 typically also has an upper surface 110 forming a plane that is approximately parallel with a plane of a lower opposing surface 112 of the IHS 101, and approximately parallel with a plane of the substrate surface 107 when coupled with a substrate as in normal use. However, rather than facing toward the substrate surface 107, the upper surface 110 faces away from the substrate surface 107. To further conduct heat away from an IC device 103, a lower surface of an active or passive cooling device is typically disposed proximate to and opposing the upper surface 110 of the IHS 101, and another TIM is disposed between and in thermally conductive contact these two surfaces. Examples of passive cooling devices include heat sinks, while examples of active cooling devices include fan heat sinks, refrigeration devices, multi-phase cooling devices, and Peltier thermoelectric cooling devices, although the embodiments are not so limited. The package 100 as shown can represent a starting condition of the example package 100 upon which an embodiment of the method described herein is practiced to form a high contrast mark on a substrate.

A package 100 can include any of several types of integrated circuit packages, such as a BGA (ball grid array) package, an LGA (land grid array) package, a PGA (pin grid array) package, or even a package utilizing a lead frame (lead frame package) for external interconnection. Any of the listed packages can be coupled within and form a portion of an electronic system. Examples of an electronic system include a computer system (e.g., mobile, desktop, server), an audio or video entertainment system (e.g., television, video media player, audio media player, satellite or cable signal converter), a system for monitoring or conducting environmental measurements (e.g., atmospheric, hydrologic, seismic, chemical), an industrial manufacturing system (e.g., robotic, analytical), a vehicular monitoring, navigation and/or control system (e.g., navigation, acceleration and deceleration control, emission monitoring and/or control, safety), or other systems that designed to operate via, or rely at least in part on processing, converting, regulating, conditioning, storing, receiving, conveying, detecting, or measuring electrical, optical, or wireless signals, images, impulses, waves, or charges, and/or information so conveyed. For example, an IC package assembly may be coupled with a computer motherboard, which is in turn assembled within a chassis of a computer system. The IC device is typically electrically coupled through the motherboard to peripheral devices, such as a monitor, input/output devices (e.g., keyboard, mouse, camera), as well as to other IC devices configured for similar and/or different purposes. In other computer systems, numerous peripheral devices may be integrated into the computer system chassis, such as the keyboard and monitor of a notebook computer, rather than being discrete but electrically connectable devices.

Figure 2A:
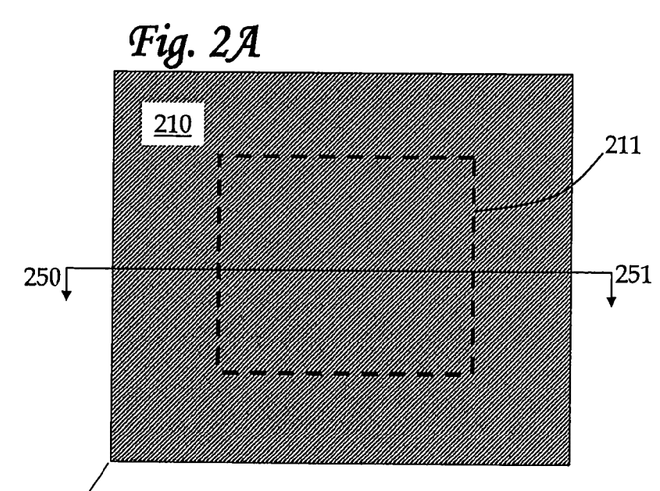
FIG. 2a depicts a top view of a surface of an integral heat spreader (IHS) according to an embodiment of the invention.
Figure 2B:
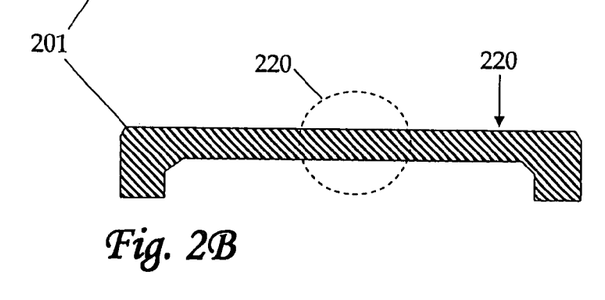
FIG. 2b depicts a cross-sectional view of an IHS taken through the line 250-251 of FIG. 2a according to an embodiment of the invention.
Figure 2C:
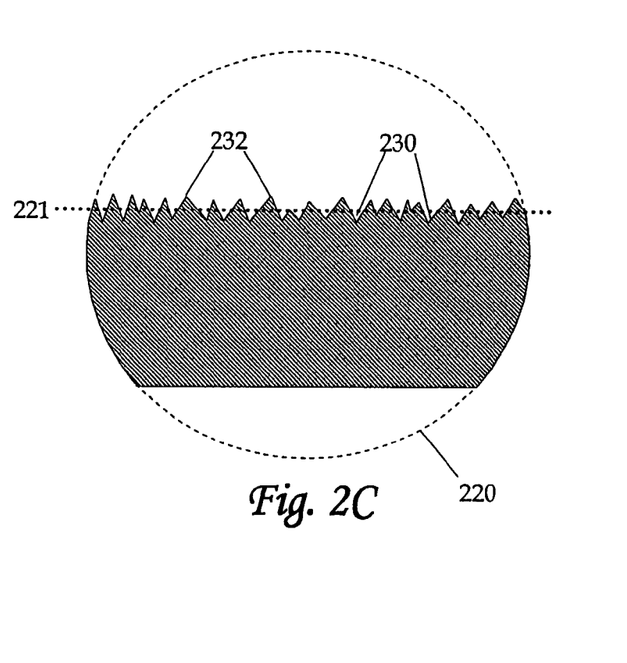
FIG. 2c depicts a magnified view of a portion of the IHS depicted in FIG. 2b according to an embodiment of the invention.

FIG. 2b depicts a cross-sectional view taken through the line 250-251 of FIG. 2a, showing an IHS 201 including a portion of the upper surface 210. FIG. 2c depicts a magnified view 220 of the similarly indicated portion in FIG. 2b. FIG. 2c depicts microtopographical features including elevated features 232 and depressions 230, which, when taken together, form a microtopographical profile of the IHS upper surface 210. Elevated features 232 and depressions 230 typically comprise artifacts of manufacturing, including scratches, pits, ridges, spurs, valleys, and other such surface defects that may result from polishing, cutting, handling, stamping, or otherwise forming an IHS 201. An IHS 201 generally has a nominal upper surface plane 221 from which elevated features 232 and depressions 230 represent deviations, forming a 'rugged' microtopographical profile. A rugged profile of this type provides a benefit by increasing the total bonding surface area between an IHS 201 and a TIM, and therefore a stronger overall bond as compared to a surface with a less rugged profile. However, due to the light scattering effects of the microtopographical features in a rugged profile, marks formed at a rugged surface suffer from poor contrast and poor readability, particularly when optoelectronic imaging systems are used to read such marks.

Figure 7:
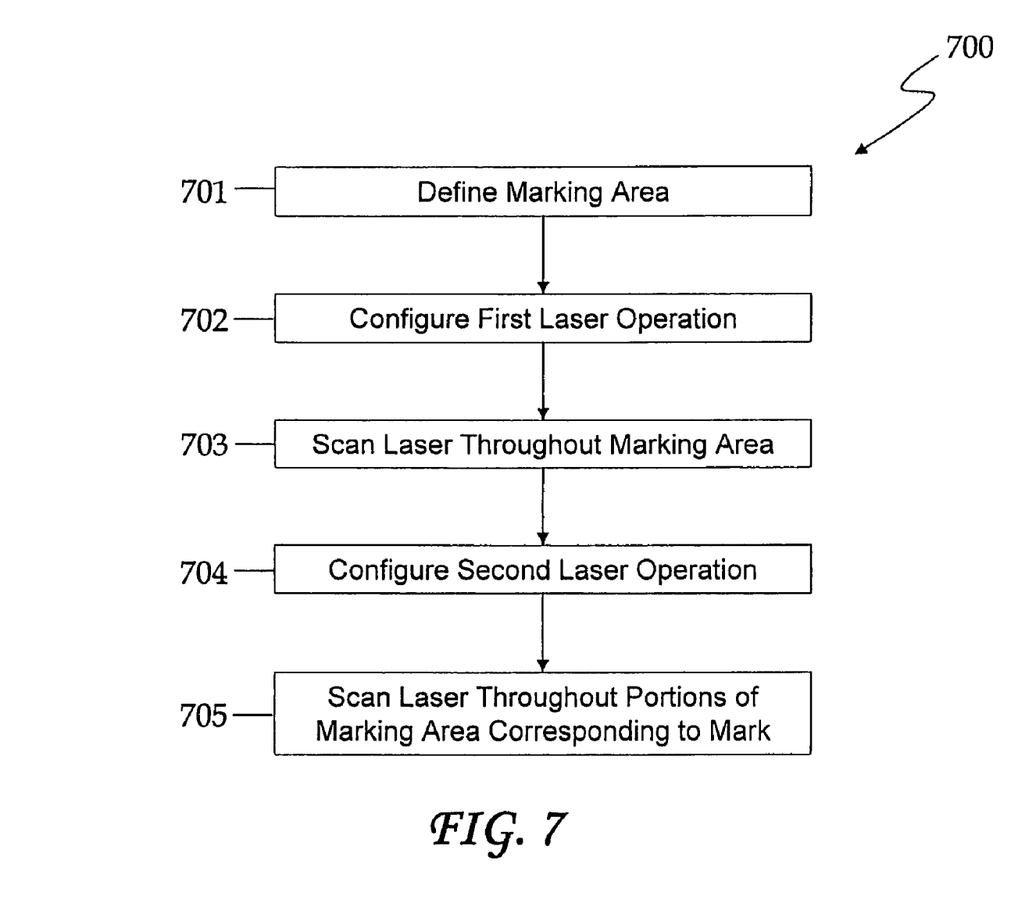
FIG. 7 depicts a method of forming a high-contrast laser mark on a metallic surface according to an embodiment of the invention.

Therefore, as shown in FIG. 2a and described at 701 of FIG. 7, a marking area is defined by defining a perimeter 211 of a marking area at a surface, such as upper surface 210 of an IHS 201. The marking area perimeter 211 may be defined physically at the IHS surface 210, or defined by coordinates in the software of a computerized manufacturing system, or by a stencil or template, or by some other device or control system configured to guide and control the positioning and/or movement of a laser relative to a surface. Therefore, a perimeter 211 of a marking area may be actual and physical, or it may be 'virtual', for example existing only as an instruction set in or for a CAD/CAM (computer aided drafting/computer aided manufacturing) system. In either situation, a defined marking area perimeter 211 can guide subsequent laser operations at the IHS upper surface 210 throughout the marking area. In essence, defining a marking area perimeter 211 also defines the marking area, as the marking area resides within the marking area perimeter 211.

The perimeter of a marking area may comprise only a small portion of an upper surface of an IHS, or it may consume a significant portion, up to and including the entire upper surface area of the IHS. Likewise, any other surface of an IHS can also be marked according to embodiments of the invention, and a perimeter of a marking area on a surface other than the upper surface of an IHS can marked in the same way as an upper surface. In individual situations, a perimeter of a marking area is generally limited by the extent of the surface area upon with the marking area is to be formed, however, a marking area can extend across two or more adjacent surfaces as well.

As shown in FIG. 7, operation 702 describes configuring a first laser operation. Configuring a laser operation can include any or all of numerous sub-operations. For example, a sub-operation could include positioning one or more integrated heat spreaders in a retaining device, or on a surface, so that the position of each IHS relative to a uniform reference point enables precise and accurate positioning of a laser relative to each IHS. Another sub-operation could include setting the operating parameters of a laser, such as intensity, power, pulse rate, or other settings that can influence how energy emitted from the laser during a first laser operation affects a surface of an IHS. Still another sub-operation could include preparing manufacturing equipment for a laser operation, including returning movable members to their start positions, setting control parameters for laser positioning, atmospheric conditions, or other outcome influencing factors.

For example, some representative laser parameters can be configured as follows for a first laser operation:
Pulse Rate; approximately 7000-9000 pulses per second
Laser Power; approximately 4-6 watts
Pulse Overlap; approximately 10%-25%
Mark (Scan) Speed; approximately 10-14 inches per second As would be recognized by one having ordinary skill in the art, these parameters may be configured differently for substrate materials other than a nickel-plated copper IHS. Other substrate materials may have either higher or lower melting temperatures, allowing configuration of one or more of these parameters outside the ranges listed here, either higher or lower than, the ranges listed here.

The exact equipment, parameter settings, materials, and other factors involved cannot be predicted and described here for each potential embodiment of a first laser operation. Practitioners of the described embodiments, as well as of those reasonably implied by the provided descriptions, have numerous substrate materials, laser equipment manufacturers and tool models, and other variables from which to choose. Rather, the scope and exact nature of the various sub-operations comprising configuring a first laser operation is largely defined by the result, and includes all actions reasonably necessary in each potential practitioner's individual situation to attain the end result of a first laser operation, as described below.

Figure 3A:
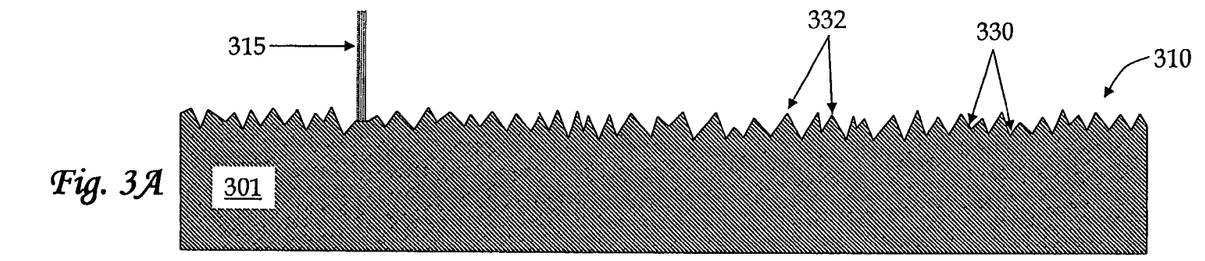
FIGS. 3a-c depict a cross-sectional view of a portion of an IHS during a first laser operation according to an embodiment of the invention.
Figure 3B:
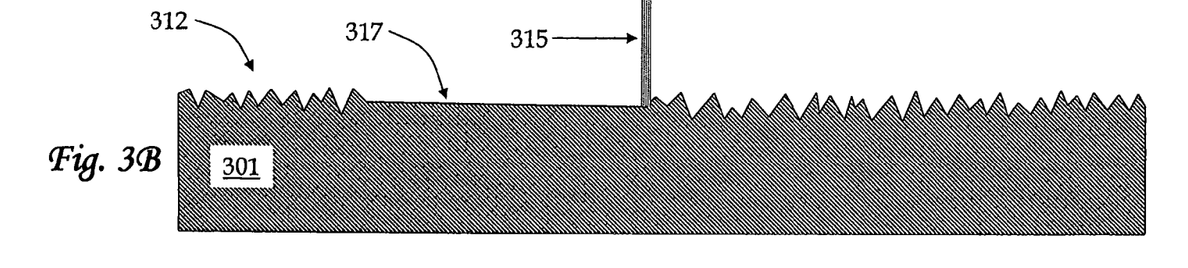

FIG. 3a depicts a magnified cross-sectional view of an IHS 301. Numerous elevated features 332 and depressions 330 of the microtopographical profile are visible at the IHS surface 310. A laser is positioned relative to the marking area according to the operation described in FIG. 7 at 702, the laser is activated, and laser emitted energy 315 is caused to strike the upper surface 310 of the IHS 301 at the marking area. The laser is then scanned throughout the marking area in a first laser operation, as shown at 703 in FIG. 7. FIG. 3b depicts the laser scanning in an approximately parallel axis relative to a nominal surface plane of an IHS. In embodiments including a metallic substrate, the laser energy 315 is configured to be able to melt metal at the surface 310 of the IHS 301. Thus, as the laser scans across the marking area 317 of the IHS 301, the elevated features 332 tend to substantially melt, and the molten metal from the elevated features 332 flows into and substantially fills the depressions 330. Substantially melting the elevated features 332 may include melting a majority of the elevated features 332 in the marking area 317, or it may include melting a major portion of each affected elevated feature 332. Substantially filling the depressions 330 may include filling individual depressions within the marking area 317 with enough molten metal to leave the depression planar or approximately planar with the surrounding surface. Substantially filling the depressions 330 may alternately mean simply reducing the depth of a depression relative to a depth condition of the depression prior to the first laser operation.

Figure 3C:
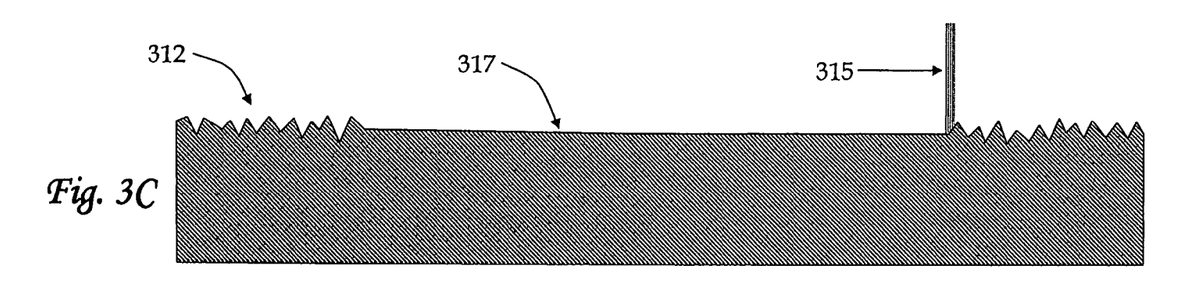

The molten metal then resolidifies, forming a relatively smoother and more reflective surface in the laser scanned portions of the marking area 317 than at the surface 312 outside the perimeter of the marking area 317. Scanning continues, as in FIG. 3c throughout the marking area 317 until the laser energy 315 melts and redeposits metal at the entire surface within the perimeter 211 of the marking area 317. Elevated features and depressions remain relatively unaffected, however, at the surface 312 outside the marking area perimeter. The effect of melting and redistributing portions of the surface of a marking area is to 'resurface' the substrate. Although resurfacing is not limited to melting and redistributing material at the substrate surface in all embodiments (for example, resurfacing can also involve removal of material from a substrate surface through laser ablation or vaporization), it may be considered a general approach for most metallic substrates.

Figure 4A:
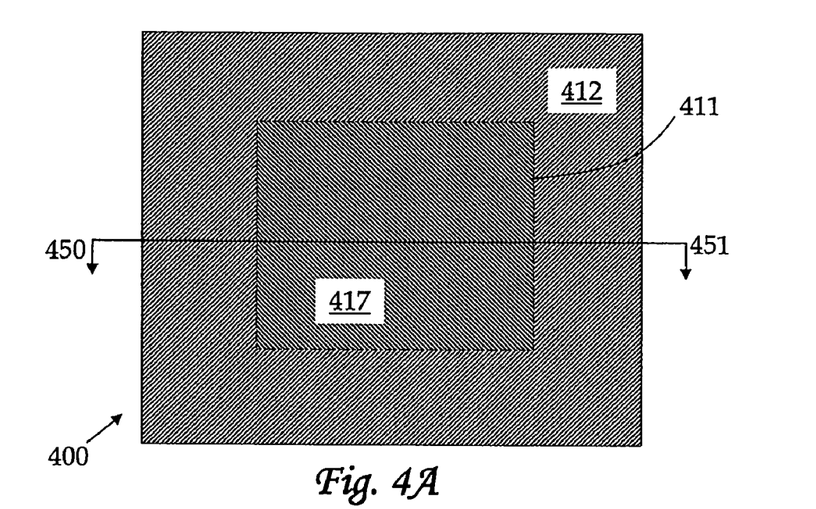
FIG. 4a depicts a top view of an IHS following a first laser operation according to an embodiment of the invention.
Figure 4B:
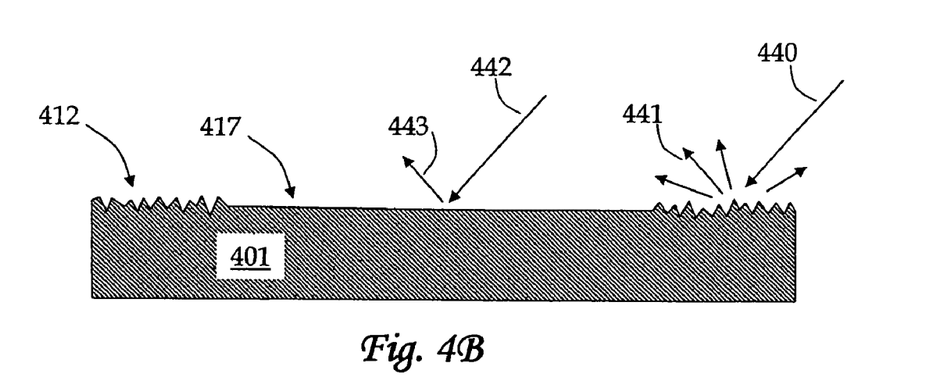
FIG. 4b depicts a cross-sectional view of the IHS of FIG. 4a taken through the line 450-451 according to an embodiment of the invention.

FIG. 4a shows a top view of an IHS 400 wherein the surface within the perimeter 411 of the marking area 417 has been scanned according the operation 703 of FIG. 7. A strong visual contrast is created between the substantially smoother, more reflective marking area 417 and the less smooth, less reflective surface outside the perimeter 411 of the marking area 417. The marking area 417 may be said to have been 'polished' by the first laser operation, as elevated features and depression at the marking area surface 417 are substantially or fully eliminated during the first laser operation. As shown at FIG. 4b, a cross-sectional view of the substrate shown in FIG. 4a taken through the line 450-451, a beam of light 442 directed at the IHS surface within the perimeter 411 of the marking area 417 is reflected as a beam 443 away from the relatively smooth surface at an approximately equal and opposite angle to that at which it arrived at the surface, with relatively little or no scattering of light from the surface.

By contrast, a similar beam of light 440 directed at the IHS surface 412 outside the perimeter 411 of the marking area 417 produces scattered light 441. This scattering is caused by the light striking the numerous angled surfaces of the elevated features and depressions at the portion of the IHS surface 412, which were not affected during the first laser operation, and reflecting away from the surface at a multitude of angles. As a result, the amount of light reflecting away at an approximately equal and opposite angle to that at which it arrived at the surface is greatly diminished. Therefore, following the first laser operation, the surface 417 of the IHS 401 within the marking area is described as having a greater reflectivity, relative to the portions of the substrate surface 312 outside the marking area.

Following the first laser operation, as shown in FIG. 7 at 704, a laser is configured for the second laser operation. The lasers used for the first and second laser operation may be the same laser, with configuration for each laser operation taking place between sequential but different laser operations. However, different laser may also be used for each laser operation. In the latter situation, each laser can be pre-configured appropriately, and the configurations can be maintained for an extended period of time without requiring reconfiguration. For example, one laser may be used exclusively for performing a first laser operation and a second laser may be used exclusively for performing a second laser operation. Therefore, it may be understood that the operations depicted in FIG. 7, while sequential in some embodiments, need not be sequential in all embodiments.

As described with regard to a first laser operation, configuring for a second laser operation can include numerous and different sub-operations, each sub-operation including various parameter settings or actions specific to a particular substrate material, laser type, equipment setup, and other variables too numerous to list here. For example, an exemplary embodiment includes using a 1064 nm (nanometer) IR (infrared) range thermal, pulsed, Q-switched Nd:YAG (neodymium-doped, yttrium aluminum garnet) laser configured for relatively higher-power scanning to form a mark at a surface of a nickel-plated, copper IHS. Other lasers, utilizing yttrium lithium fluoride or yttrium vanadate will likely also work for disposing a mark at other substrate surfaces. Likewise, other transition wavelengths than 1064 nm (e.g., 940 nm, 1120 nm, 1320 nm) can provide good results in certain situations. Various operational parameters of a Nd:YAG laser are likely to be different than those used with another type of laser, although a different laser and a Nd:YAG laser may both be capable of forming a mark into a marking area of an IHS. An example of configuring for a second laser operation could include selecting a laser engraving mode from a menu of functional options, or setting one or more parameters of a laser to an operational condition that corresponds to an engraving mode appropriate for the type of substrate material that will be marked. Different substrate materials will ablate at different laser powers, so a primary determinant for various laser types and operational settings is the ability for the laser to ablate the substrate material and form a mark at the material surface. The settings to use for any particular combination of laser type and substrate material can be determined through relatively routine experimentation by someone of ordinary skill in the art, and as informed by this description.

For example, some representative laser parameters for engraving a nickel-plated copper IHS can be configured as follows for a second laser operation:

Pulse Rate; approximately 5000-6000 pulses per second

Laser Power; approximately 9-12 watts

Pulse Overlap; approximately 10%-25%

Mark (Scan) Speed; approximately 10-14 inches per second

As would be recognized by one having ordinary skill in the art, these parameters may be configured differently for engraving a mark in materials other than a nickel-plated copper IHS, as other material may be ablated or otherwise marked when one or more of these parameters are configured outside, either higher or lower than, the ranges listed here.

Figure 5:
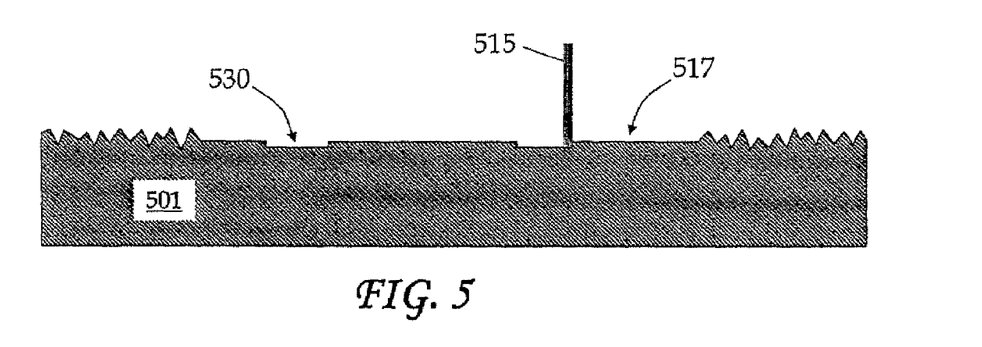
FIG. 5 depicts a cross-sectional view of a portion of an IHS during a second laser operation according to an embodiment of the invention.

Referring to FIG. 5, once configured for a second laser operation, a laser 515 is scanned throughout those portions of a marking area 517 at a surface of a substrate 501 that correspond to a mark. A marking area may be absolutely or approximately planar, or it may have some contour remaining after the first laser operation. In either situation, the marking area can be described as having a nominal surface plane. With regard to a marking area having contour, a nominal surface plane can be defined as a plane corresponding to the highest point of the elevated contour features, or alternatively, to the lowest point of the depressions. A nominal plane may likewise comprise a plane corresponding to the approximate average of the collective high points and low points, or a plane corresponding to an average between an absolute highest point and lowest point. Regardless the particular determination of a nominal plane according to alternative embodiments, a laser 515, when configured as described above, is able to engrave the features of a mark 530 to a defined depth into a nominal plane of the marking area 517.

Figure 6:
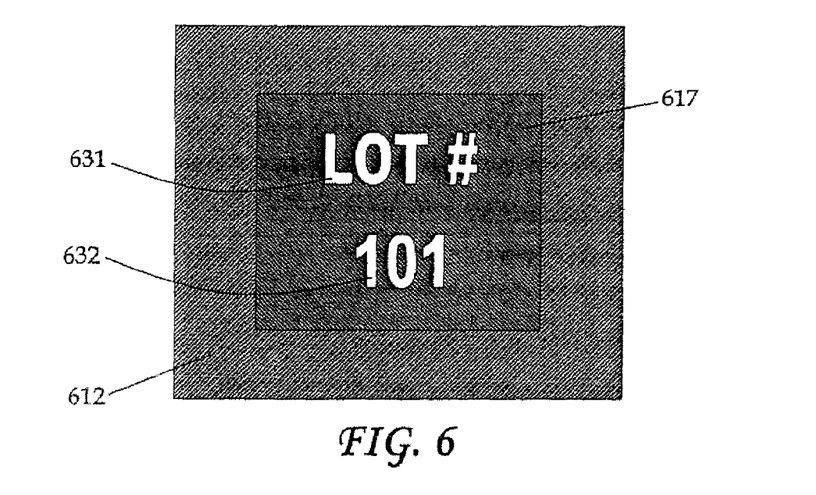
FIG. 6 depicts a top view of an IHS having a mark following a second laser operation according to an embodiment of the invention.

A 'readable' mark may be human readable or machine readable. A mark may be human readable and include alphabetic 631 and/or numeric 632 characters, as shown in FIG. 6, or may be machine readable/recognizable and include symbols that represent alphabetic and/or numeric characters (e.g., bar codes, UPC symbols). A mark may include machine readable/recognizable symbols which do not represent alphabetic and/or numeric characters, or symbols that have independent and/or recognizable significance (e.g., logos, trademarks and/or service marks, certification marks). 'Machine readable/recognizable" generally indicates that the mark can be detected, and an image of the mark can be captured by an optoelectronic imaging system. Additionally, the image is captured with sufficient resolution for the optoelectronic system, or another system utilizing the image captured by the optoelectronic system, to interpret and/or recognize the significance of the mark or some portion thereof. In a broad sense, embodiments of the invention can include virtually any type of mark that can be formed at or into a substrate surface 612, a portion of the surface 617 having been prepared according to the first laser operation.

The individual characters or features of a mark can be formed to have a white or nearly white appearance, providing good contrast relative to a shiny marking area of a substrate. In alternate embodiments, it is also possible to form characters or features of a mark having a color other than white. Numerous materials react when exposed to heat (thermally reactive materials) by changing color, or changing from transparent to colored. These materials, or other materials already possessing a color, may bond with a substrate surface when disposed at the surface and heated to or above an activation temperature. Some materials, when combined with certain other materials, react and form another material have a different color than any of the materials that were combined. Materials may retain their color following heating, or as described, may react by presenting a different color. For clarity herein, such materials are simply called 'thermally reactive materials', and a 'different color' can also include simply changing to a different hue or shade of the same general color. Disposing a thermally reactive material or combination of materials at or near a substrate surface during or prior to a second laser operation, then performing the second laser operation so that the thermally reactive material is affected by the laser, imbues a mark with color.

A marking area and a mark can be formed at a surface of an IHS either prior to or after coupling the IHS with a substrate of an IC device package. For example, a marking area can be formed prior to assembly of an IC package, while a mark is formed at the marking area following package assembly. Likewise, a marking area and some marks or some portions of a mark can be formed prior to assembly, while other marks or portions of a mark can be formed following assembly. Alternatively, at least one of a plurality of marking areas can be formed prior to package assembly, while at least another of the plurality is formed following assembly. Of course, in the case of a plurality of marking areas, all of the plurality can likewise be formed either prior to or following package assembly. In some situations, an IC device is coupled with an IHS prior to package assembly, and marking areas and marks can be formed either prior to or following coupling of the IHS and the IC device, and prior to package assembly. The method for forming a mark can also influence the sequence of when the mark is formed relative to when the package is assembled. For example, in alternate embodiments, a mark can be formed at a laser polished marking area by chemically etching the marking area surface, or by mechanically engraving the mark into the surface. Chemicals used to etch the substrate surface may not be compatible with other package materials, so it may be advantageous in such situations to etch the mark into an IHS surface prior to assembling the package. Alternatively, a mark may be formed by stamping the mark into a substrate surface using an amount of force that could damage an IC device. In this situation, the risk of damage to an IC device also indicates that a mark would generally be formed prior to assembling an IC device with the IHS.

A metallic surface, such as that of an IHS, can comprise nickel, as nickel-plated copper integral heat spreaders are common. However, numerous other metallic material, particularly noble metals, may be used to plate IHS surfaces, including gold, silver, palladium or platinum. Other metallic substrate surfaces can likewise include tin, aluminum, copper, stainless steel, or other thermally conductive metals. Each material has a characteristic melting temperature which can influence the configuration of at least one of the first and/or second laser operation. It should, however, be clearly understood from the description provided herein that embodiments of the invention are not limited to a surface of an IHS. Alternative embodiments could similarly include most surfaces and materials that are or could be configured to be responsive to a laser operation to form a marking area, and to likewise be responsive to another laser operation to form features of a mark. Such materials may include thermoplastic materials, non-crystalline (e.g., amorphous) materials, ceramic materials, or others. Therefore, the use of an IHS in exemplary embodiments herein is not to be construed as a limitation of the potential and embodiments.

Figure 8:
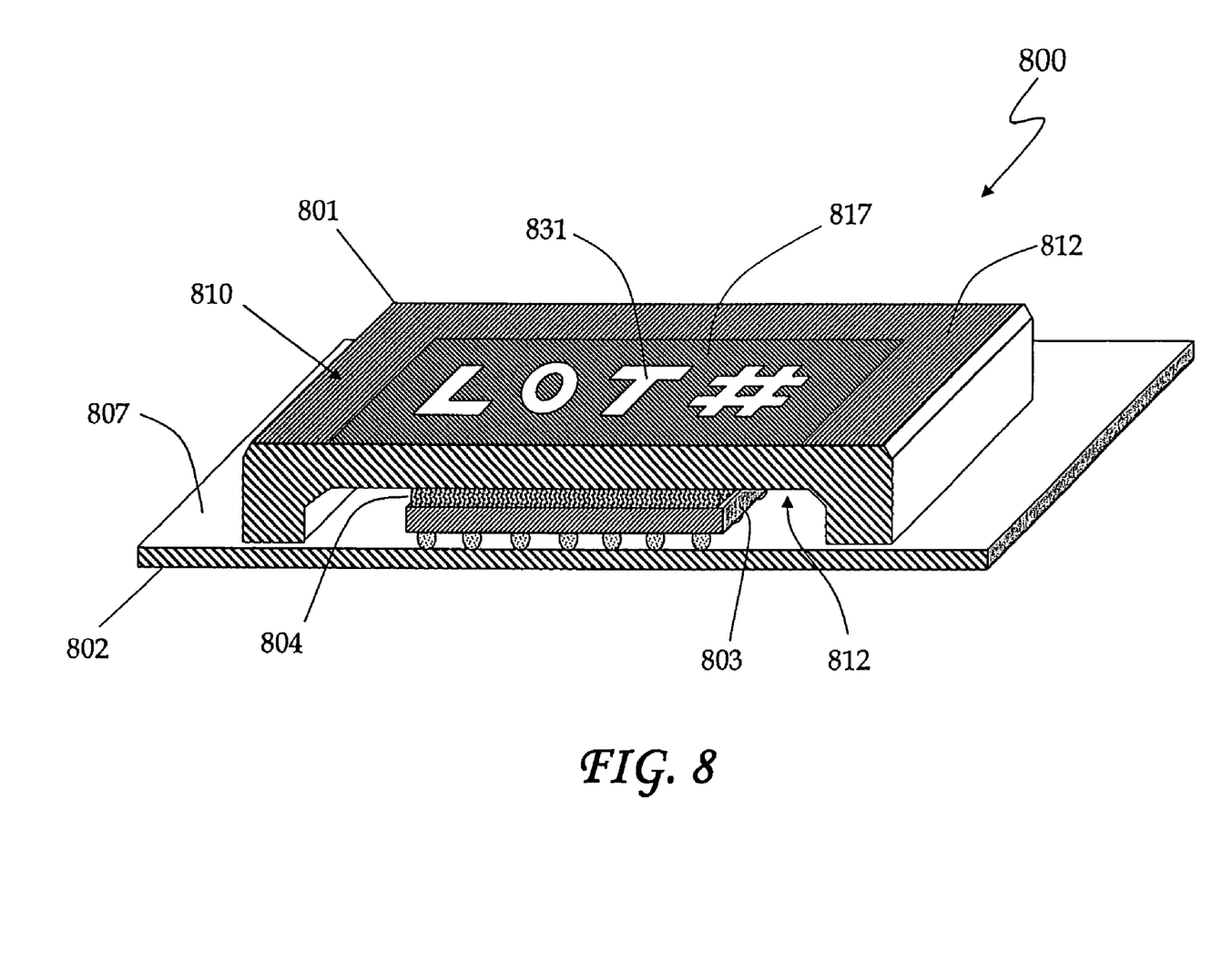
FIG. 8 depicts an oblique cross-sectional view of an integrated circuit package according to an embodiment of the invention.

Therefore, as depicted in FIG. 8, an assembly 800 can be formed which includes a substrate 802, an IC device 803 electrically coupled with an upper surface 807 of the substrate 802 (e.g., a printed circuit substrate), and an IHS 801 thermally coupled with the IC device 803. The IC device 803 is interposed between a lower surface 812 of the IHS 801 and the upper surface 807 of the substrate 802, and a TIM 804 is interposed between the IC device 803 and the lower surface 812 of the IHS 801. The IHS 801 also possesses an upper surface 810 that includes a portion 812 having microtopographical features varying in height and/or depth around a nominal plane of the surface and defining a microtopographical profile. The upper surface 810 also includes another portion 817 at which the surface variations from a nominal plane (e.g., microtopographical features), have been reduced or eliminated through a laser operation. This latter portion 817 is more reflective of visible light and a has reduced microtopographical profile relative to the portion 821 at which microtopographical features remain, and also has a nominal plane which may be determined as described above.

The assembly 800 also includes a mark 831, including features having a nominal depth below the nominal plane of the reflective portion 817. Although the actual depth of each feature of a mark 831 may vary, a nominal depth of the mark 831 can include an average depth of the features, or a designed depth, or could reside anywhere between the minimum and the maximum depth of any or all of the features of the mark 831. The mark 831 could include, as already described, human and/or machine readable features, which could be alpha-numeric, could represent alpha-numeric, or could otherwise have an acquired significance that is apparent when sufficiently resolved against a high contrast background surface and recognized by a reader. A mark 831 that is machine readable is, in an embodiment, readable by an optoelectronic imaging system.

As previously described herein, an assembly 800 could include any of numerous types of integrated circuit packages (e.g., BGA, LGA, PGA), and could comprise a portion of an electronic device, for example a computer system.

In the above description, numerous specific details are set forth such as examples of specific materials or components in order to provide a thorough understanding of embodiments of the present invention. It will be apparent, however, to one skilled in the art that these specific details need not be employed to practice embodiments of the present invention. In other instances, well known components or methods have not been described in detail in order to avoid unnecessarily obscuring embodiments of the present invention.

The terms "on," "above," "below," "between," and "adjacent" as used herein refer to a relative position of, for example, one layer or element with respect to other layers or elements. As such, a first element disposed on, above or below another element may be directly in contact with the first element or may have one or more intervening elements. Moreover, one element disposed next to or adjacent to another element may be directly in contact with the first element or may have one or more intervening elements.

Any reference in the specification to "one embodiment" or "an embodiment" means that a particular feature, structure, or characteristic described in connection with the embodiment is included in at least one embodiment of the claimed subject matter. The appearances of the phrase, "in one embodiment" in various places in the specification are not necessarily all referring to the same embodiment. References herein to an 'aspect', 'alternative', 'option', or a similar term may also represent a separate embodiment including at least one unique feature, structure, or characteristic.

The foregoing detailed description and accompanying drawings are only illustrative and not restrictive. They have been provided primarily for a clear and comprehensive understanding of the embodiments of the invention, and no unnecessary limitations are to be understood therefrom. Numerous additions, deletions, and modifications to the embodiments described herein, as well as alternative arrangements, may be devised by those skilled in the art without departing from the spirit of the embodiments and the scope of the appended claims.

I claim:

1. A method, comprising:
    defining a marking area at a surface of a substrate;
    configuring a first laser operation to enable resurfacing of the substrate surface;
    scanning a laser configured for the first laser operation throughout the marking area, resurfacing the marking area of the substrate surface;
    configuring a second laser operation to enable forming a mark; and
    scanning a laser configured for the second laser operation throughout those portions of the marking area corresponding to the mark and disposing the mark at the marking area.

2. The method of claim 1, wherein configuring the first laser operation comprises configuring a laser for high speed, low power scanning.

3. The method of claim 1, wherein the laser of the first laser operation is a Nd:YAG laser.

4. The method of claim 1, wherein the substrate is metallic.

5. The method of claim 1, wherein the substrate is an integral heat spreader.

6. The method of claim 1, wherein resurfacing the substrate surface comprises substantially melting microtopographical features in the marking area, and depositing the molten material to form a substantially smoother surface in the marking area.

7. The method of claim 1, wherein the marking area has a greater reflectivity relative to portions of the substrate surface outside the marking area following the first laser operation.

8. The method of claim 1, wherein forming the mark comprises laser engraving to a defined depth into the nominal surface plane of the marking area.

9. The method of claim 1, wherein at least a portion of the mark appears relatively white when exposed to approximately the entire visible spectrum of light energy.

10. The method of claim 1, wherein the mark is at least one selected from the group consisting of alphabetic characters, numeric characters, symbols representing at least one of alphabetic and numeric characters, and symbols with independent significance.

11. The method of claim 1, further comprising reading the mark with an optoelectronic imaging system.

12. The method of claim 1, further comprising disposing the substrate adjacent to an integrated circuit device as part of an integrated circuit package.

13. The method of claim 1, wherein configuring the second laser operation further comprises disposing a thermally reactive material at or near the marking surface, the thermally reactive material being capable of reacting to exposure to laser energy by imbuing a mark with coloration characteristics.

* * * * *

UNITED STATES PATENT AND TRADEMARK OFFICE
CERTIFICATE OF CORRECTION

| | |
|---|---|
| PATENT NO. | : 7,615,404 B2 |
| APPLICATION NO. | : 11/591001 |
| DATED | : November 10, 2009 |
| INVENTOR(S) | : Lee Kim Loon |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 182 days.

Signed and Sealed this

Nineteenth Day of October, 2010

David J. Kappos
*Director of the United States Patent and Trademark Office*